Oct. 9, 1956 R. R. BIGLER ET AL 2,765,765

APPARATUS FOR THE MANUFACTURE OF PIEZOELECTRIC CRYSTALS

Filed Sept. 3, 1952 2 Sheets-Sheet 1

INVENTORS
ROBERT R. BIGLER &
WILLIAM SCHAFER, JR.
BY Charles H. Brown
ATTORNEY

APPARATUS FOR THE MANUFACTURE OF PIEZOELECTRIC CRYSTALS

Filed Sept. 3, 1952 2 Sheets-Sheet 2

INVENTORS
ROBERT R. BIGLER &
WILLIAM SCHAFER, JR.
BY Charles H. Brown
ATTORNEY

United States Patent Office 2,765,765

Patented Oct. 9, 1956

2,765,765

APPARATUS FOR THE MANUFACTURE OF PIEZOELECTRIC CRYSTALS

Robert R. Bigler, Erlton, and William Schafer, Jr., Camden, N. J., assignors, by mesne assignments, to the United States of America as represented by the Secretary of the Army Application September 3, 1952, Serial No. 307,695

3 Claims. (Cl. 118—49)

This invention relates to the manufacture of piezoelectric crystals, and more particularly, to a method of and apparatus for manufacturing crystals having a predetermined frequency of oscillation.

When a piezoelectric crystal wafer is mounted between electrode plates to which an appropriate oscillatory voltage is applied, the crystal will oscillate at a frequency determined primarily by its physical dimensions. There are many advantages in having the electrodes of the crystal constructed by depositing a layer of metal which firmly adheres to the surface of the crystal. Such an adherent layer can be deposited on the crystal by means of vaporization in a very high vacuum. In carrying out this procedure, a quartz wafer is placed in front of and at a certain distance from the material to be deposited, which material is maintained by electric heating at a temperature sufficiently high for its vaporization, the entire assembly being contained in a hermetically sealed chamber in which high vacuum is maintained. Gold is a preferred metallic material which is projected thermally in straight paths from a source against the surface of a quartz crystal at sufficient speed to form a strongly adhering layer of metal.

The layer of metal deposited on a quartz wafer effects its natural frequency of oscillation. In the manufacture of the crystal to be oscillatory at a predetermined frequency, the quartz wafers are initially ground to a thickness less than the required final thickness, and consequently, to a higher frequency of oscillation than is desired. Metal is then evaporated onto the surfaces of the quartz wafer until the thickness of the metal is such as to result in the crystal having the desired natural frequency of oscillation.

It has been necessary in the manufacture of piezoelectric crystal units to go through a number of manufacturing steps. The crystal wafers were first ground to a thickness less than the thickness which would provide the desired frequency of oscillation. Then electrodes were deposited on the surfaces of the crystal wafer with the thickness not sufficiently great to provide the desired frequency of oscillation, but sufficient to provide conductive electrodes. Next the crystal was mounted in a holder for the purpose of providing electrical connections to the deposited electrodes for frequency measuring purposes. Finally the crystal unit with its holder was placed in circuit with a source of electrical oscillation and a frequency measuring device, and additional metal was added by thermo-deposition to the deposited electrodes until an additional layer had been added which was sufficient to bring the material frequency of oscillation to the desired value.

It is an object of this invention to provide an improved method of, and apparatus for, manufacturing piezoelectric crystal units whereby the manufacture is more rapid and less expensive.

It is another object to provide for the manufacture of crystals having metallic plates or electrodes thermally deposited thereon so as to economize on the amount of metal needed.

It is a further object to provide for the manufacture of crystal units with a minimum number of separate manufacturing steps.

It is a further object to provide means for simultaneously depositing metallic plates or electrodes and circuit-completing strips on quartz units.

In one aspect, the invention teaches the method of manufacturing crystal units including a plug-in base whereby the piezoelectric wafer is mounted with opposite sides of its peripheral edge supported by electrode supports of a plug-in base, and the whole unit is placed in an evacuated chamber where a metal, for example gold, is vaporized onto both sides of the crystal wafer. The metal is deposited on the large surfaces of the wafer in a pattern such that the deposited metal on each side of the wafer extends to and makes electrical contact with one of the electrode supports. The desired pattern is obtained by interposing a baffle plate or mask between the crystal wafer and the source of vaporized metal, the baffle plate being provided with an aperture having a configuration such as will provide the desired pattern of deposited material on the crystal wafer. An oscillatory circuit and frequency measuring means are connected to the prongs of the plug-in base. Metal is vaporized onto the surfaces of the crystal wafer and when a certain amount of material has been deposited, electrodes will be formed which are connected to the electrode supports, and in turn through the prongs of the plug-in base to the frequency measuring equipment. The deposition process is continuous from the time that metal is first evaporated onto the surface of the bare crystal, through the time when sufficient material is deposited to form electrodes connected to the terminals of the plug-in base, to the time when sufficient metal is deposited to provide the desired natural frequency of oscillation as indicated by the frequency measuring equipment.

Other objects, features, aspects and advantages of the invention will be apparent to those skilled in the art from the following detailed description, taken in conjunction with the appended drawings, wherein.

Figure 1:
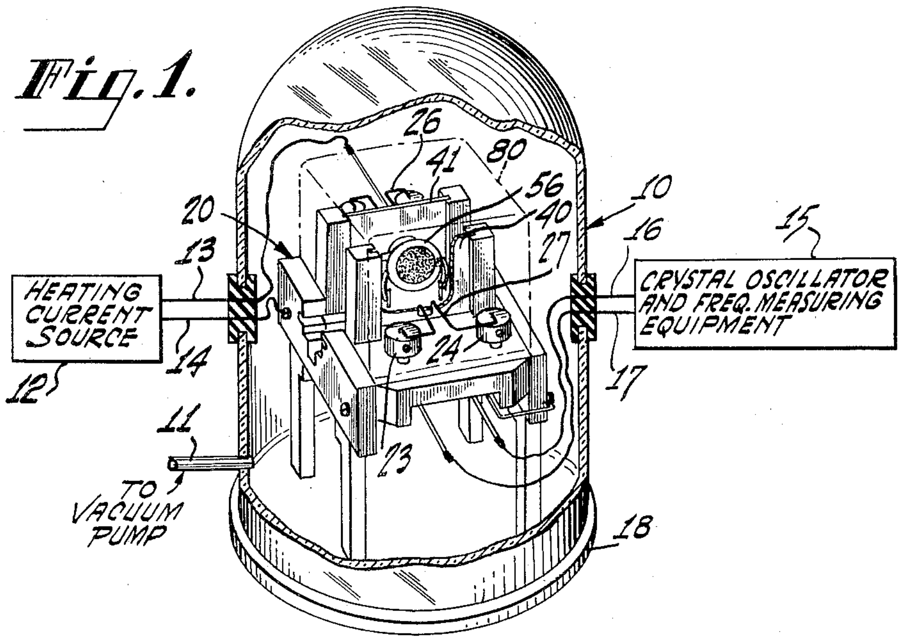
Fig. 1 is a perspective view of apparatus constructed according to the teachings of this invention, portions of the drawing being broken away to more clearly illustrate the construction.

Referring now to Figure 1, a fixture (as shown in detail in Fig. 2) is mounted in a bell-jar chamber 10 within which a high vacuum is maintained by means of a vacuum pump connected to tube 11. A source of heating current 12 is connected by wires 13 and 14 to the fixture inside the bell-jar chamber 10. Similarly an oscillator circuit and frequency measuring equipment 15 is connected by wires 16 and 17 to the fixture inside chamber 10. The wires 13, 14, 16, 17 and tube 11 will normally enter the bell-jar chamber 10 through the base 18 thereof, and they have been shown in Figure 1 to enter the chamber through the glass portion merely for reasons of simplicity and clarity of illustration.

Figures 2, 3, 4:
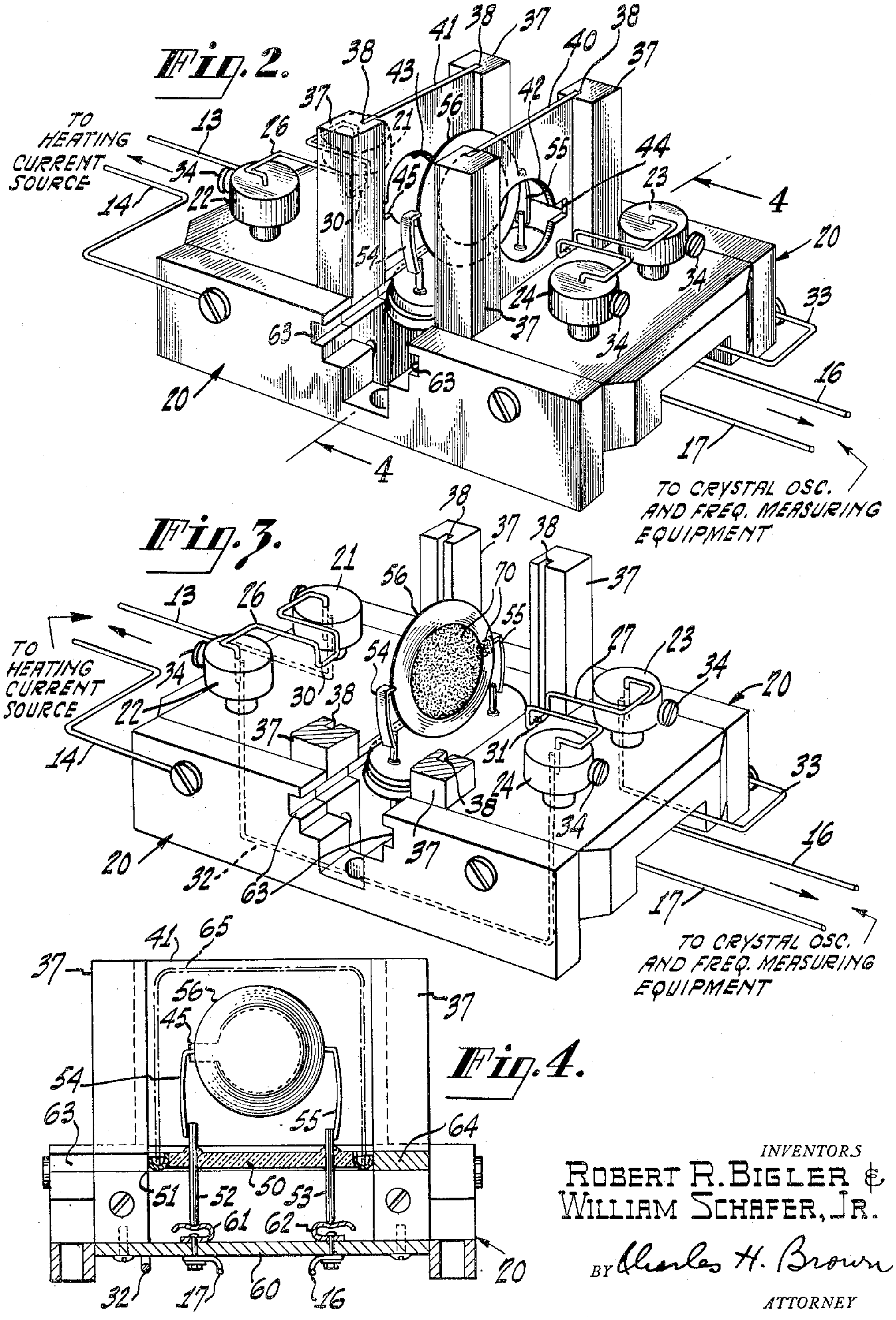
Fig. 2 is a perspective view of a portion of the apparatus shown in Fig. 1.
Fig. 3 is a fragmentary perspective view corresponding to Fig. 2.
Fig. 4 is a section taken substantially on the line 4—4 of Fig. 2.

The fixture shown to advantage in Figures 2, 3, and 4 consists of a base or platform 20 carrying heater wire supports 21, 22, 23 and 24. Heater wires 26 and 27 are mounted on supports 21, 22 and 23, 24, respectively. Heater wire 26 and 27 are formed in a configuration including depending U-shaped portions 30 and 31 which accommodate small pieces of noble metal, such as gold, to be vaporized. Connections are made to heater wires 26 and 27 by means of wires 32 and 33 which are urged into electrical contact with the heater wires by means of clamping screws 34 on heater wire supports 21, 22, 23, 24. The heater wires are connected in series electrical circuit with a source of heating current 12, the connection being through wire 13, heater wire 26, wire 32, heater wire 27, wire 33, and via a ground connection back through wire 14.

Four vertical posts 37 having vertical slots 38 therein are mounted on the base 20 of the fixture between heater wires 26 and 27. The vertical slots in posts 37 accommodate removable baffle plates 40 and 41. Baffle plates 40 and 41 have centrally located apertures 42 and 43 therein, the apertures having a generally circular configuration with radially extended notches 44 and 45.

A crystal unit, as shown to advantage in Figure 4, consists of an insulating glass base 50, a metal mounting ring 51 thereabout, electrode prongs 52 and 53 fused therein, support wires 54 and 55 welded to prongs 52 and 53, and a quartz wafer 56 supported at opposite points on its peripheral edge by support wires 54 and 55. The quartz wafer 56 is cemented, or soldered to the support wires 54 and 55. Base 20 has mounted on the bottom thereof an insulating plate 60 on which are secured spring contact clips 61 and 62 which provide electrical connections to prongs 52 and 53. The base 20 is provided with horizontal slots 63 in the central portion thereof to accommodate the base 50, 51 of the crystal unit. By the socket construction shown and described, a crystal unit readily may be inserted into the fixture with a sliding motion in tracks 63, 63 to a position determined by stop 64, in which position prongs 52, 53 make electrical contact with spring clips 61, 62 which are in turn connected through wires 16, 17 to oscillator and frequency measuring equipment 15. It may be noted that the crystal unit shown in the drawings is a complete unit except for the metal cover or can, represented by dotted line 65 in Figure 4, which is attached to metal ring 51 in the final step of the manufacture of a saleable crystal unit.

In the manufacture of crystal units in accordance with the teachings of this invention, a crystal unit having a bare quartz crystal 56 mounted therein is slipped on tracks 63, into the operating position determined by locating stop 64 in the fixture. In this position the quartz crystal 56 is between baffle plates 40 and 41 and is aligned with the centers of the apertures 42 and 43 therein, the gold carrying depending portions 30 and 31 of heater wires 26 and 27 being also aligned with the apertures 42 and 43 and the bare quartz crystal 56. The bell-jar 10 is then placed over the fixture and the chamber is evacuated through tube 11 by means of a vacuum pump. When the vacuum has reached a value which permits the vaporization of the gold by the heat generated in heater wires 26 and 27, the gold vapor is projected or sputtered in straight lines from points 30 and 31 of the heater wires. That portion of the gold which goes through apertures 42 and 43 is deposited on the two large surfaces of crystal 56 in a pattern 70 determined by the configurations of the apertures. It will be noted that configurations are such that a layer of metal is deposited on the side of the crystal visible in the drawings in the form of a generally circular area with a strip extending therefrom to the support wire 55. Gold from point 30 on heater wire 26 is deposited on the other side of crystal 56 in a generally circular area with a strip extending therefrom to support wire 54. This is accomplished, as is clearly shown in Figure 2, by having aperture plates 40 and 41 arranged with the radial notches 45 extending in opposite direction so that the gold passing through the notches is deposited to and on support wires 54 and 55, the connection being made on one side of the crystal with support 54 and on the other side of the crystal with support 55.

As soon as a continuous layer of metal is deposited on both sides of the crystal, an electrical circuit is completed from the two layers through the plug-in base and wires 16, 17 to oscillator and frequency measuring means 15. When this connection is completed the crystal is operative in an oscillatory circuit and the natural frequency thereof is readily measurable by frequency measuring means well known in the art. The quartz crystal is initially ground so that where a thin layer of metal is deposited therein which is barely sufficient to form electrodes in circuit with prongs 52, 53, the crystal oscillates at a higher frequency than is desired for the ultimate product. The process of depositing metal on the crystal is continued until such time as the frequency measuring equipment indicates that the desired natural frequency of operation has been reached. It is apparent that the process which has been described, from the time that a crystal unit having a bare quartz crystal mounted therein is placed in the fixture, until the time when the crystal unit oscillates at the desired natural frequency, is a continuous, uninterrupted process. There is no delay such as is occasioned when a conductive layer is first evaporated onto the surface of a crystal and then the crystal is removed from the evacuated chamber and later inserted in another evacuated chamber for depositing sufficient metal to bring the frequency of the crystal to the desired value. According to this invention, the only remaining step in the manufacture is to slide the crystal unit out of the fixture and crimp a protective shielding can 65 to the ring 51 on the base 50.

The construction shown wherein baffle plates 40 and 41 are removably mounted in slots 38 in posts 37 facilitates the substitution of aperture plates with plates having apertures of different configuration, as may be desired in the manufacture of different types of crystals.

Since metal is evaporated in all directions from points 30 and 31 on the heater wire, it is desirable to place a cover, represented by dotted line 80 in Figure 1, over the fixture to intercept metal going in directions other than in the direction of the crystal 56. The metals normally used for thermo-deposition on quartz crystal are in the precious metal category and are well worth recovering.

What is claimed is:

1. A fixture for use in an evacuated chamber for thermal deposition of a conductive layer on a face of a piezoelectric crystal mounted by electrically conductive supports on a plug-in base, comprising in combination, a platform and mounted on said platform, in spaced alignment, a heater means, an apertured plate and a socket for said plug-in base, whereby a material evaporated from said heater means may pass through the aperture of said apertured plate and form a layer on a crystal unit mounted in said socket, the aperture in said apertured plate including a radially extending portion thru which material evaporated from said heater passes to form a layer extending to and covering a portion on one of said conductive supports.

2. A fixture for depositing conductive layers on both sides of a piezoelectric crystal mounted between conductive supports on a plug-in base, comprising, a platform, two metal-evaporating heaters mounted at spaced points on said platform, a socket for said plug-in base mounted in said platform at a point equidistant from said heaters, a first plate mounted on said platform between one of said heaters and said socket, a second plate mounted on said platform between the other of said heaters and said socket, said plates each having a generally circular aperture therein with a radially extending notch, said elements being alinged so that metal may be simultaneously evaporated from said heaters to the two sides of a crystal mounted on a base positioned in said socket, the notches in said plates causing metal to be deposited in layers extending to and covering portions of respective ones of said conductive supports.

3. A fixture as defined in claim 2 wherein said socket is constituted by horizontal slots in said platform providing tracks for said plug-in base and spring contact clips positioned to be engaged by said prongs.

References Cited in the file of this patent

UNITED STATES PATENTS

| | | |
|---|---|---|
| 1,717,193 | Dantsizen | June 11, 1929 |
| 1,765,413 | Fruth | June 24, 1930 |
| 2,211,583 | Ruben | Aug. 13, 1940 |
| 2,384,578 | Turner | Sept. 11, 1945 |
| 2,392,429 | Sykes | Jan. 8, 1946 |
| 2,505,370 | Sykes | Apr. 25, 1950 |
| 2,545,576 | Godley | Mar. 20, 1951 |
| 2,639,392 | Warner | May 19, 1953 |